United States Patent
Vaillancourt et al.

(10) Patent No.: US 12,424,594 B2
(45) Date of Patent: Sep. 23, 2025

(54) INTEGRATED DIAMOND SUBSTRATE FOR THERMAL MANAGEMENT

(71) Applicant: Raytheon Company, Waltham, MA (US)

(72) Inventors: Jarrod Vaillancourt, South Hampton, NH (US); Matthew C. Tyhach, Wakefield, MA (US)

(73) Assignee: Raytheon Company, Arlington, VA (US)

( * ) Notice: Subject to any disclaimer, the term of this patent is extended or adjusted under 35 U.S.C. 154(b) by 315 days.

(21) Appl. No.: 17/657,390

(22) Filed: Mar. 31, 2022

(65) Prior Publication Data

US 2023/0317692 A1 Oct. 5, 2023

(51) Int. Cl.
H01L 25/16 (2023.01)
H01L 23/00 (2006.01)
H01L 25/00 (2006.01)

(52) U.S. Cl.
CPC .............. *H01L 25/16* (2013.01); *H01L 24/05* (2013.01); *H01L 24/08* (2013.01); *H01L 24/29* (2013.01); *H01L 25/50* (2013.01); *H01L 2224/0557* (2013.01); *H01L 2224/05644* (2013.01); *H01L 2224/08148* (2013.01); *H01L 2924/10254* (2013.01); *H01L 2924/10272* (2013.01); *H01L 2924/1306* (2013.01); *H01L 2924/1423* (2013.01)

(58) Field of Classification Search
None
See application file for complete search history.

(56) References Cited

U.S. PATENT DOCUMENTS

| 6,825,559 B2 * | 11/2004 | Mishra | H01L 23/367 257/532 |
| 8,470,701 B2 | 6/2013 | Rogers et al. | |
| 9,087,854 B1 | 7/2015 | Ha et al. | |
| 9,226,383 B2 * | 12/2015 | Mishra | H05K 1/181 |

(Continued)

FOREIGN PATENT DOCUMENTS

| CN | 106298882 A | * | 1/2017 | ........... H01L 29/404 |
| CN | 108376705 A | | 8/2018 | |

(Continued)

OTHER PUBLICATIONS

Robert Coffie "Field Plate Models Applied to Manufacturability and for RF Analysis", CS MANTECH Conference, May 18-21, 2015 (Year: 2015).*

(Continued)

*Primary Examiner* — Telly D Green

(57) ABSTRACT

Described herein is an apparatus and a method for thermal management. The apparatus includes an integrated circuit (IC) including at least one field effect transistor, wherein each at least one FET comprises a gate, a drain, and a source; and a diamond substrate bonded to the gate, the drain, and the source of each of the at least one FETs, wherein the diamond substrate includes at least one tuning element. The method includes forming at least one FET on an IC, wherein each at least one FET comprises a gate, a drain, and a source; and bonding a diamond substrate to the gate, the drain, and the source of each of the at least one FETs, wherein the diamond substrate includes at least one tuning element.

20 Claims, 10 Drawing Sheets

(56) References Cited

U.S. PATENT DOCUMENTS

| | | | |
|---|---|---|---|
| 9,679,981 B2 * | 6/2017 | Sriram | H10D 64/411 |
| 10,374,553 B2 | 8/2019 | Ejeckam et al. | |
| 10,658,264 B2 | 5/2020 | Zou et al. | |
| 11,127,652 B2 * | 9/2021 | Tyhach | H01L 29/7786 |
| 2003/0022395 A1 * | 1/2003 | Olds | H01L 21/76895 |
| | | | 257/E21.59 |
| 2004/0130037 A1 * | 7/2004 | Mishra | H01L 21/8252 |
| | | | 257/E23.008 |
| 2005/0006669 A1 | 1/2005 | Mishra et al. | |
| 2005/0067716 A1 * | 3/2005 | Mishra | H01L 27/0605 |
| | | | 257/E23.008 |
| 2006/0088978 A1 * | 4/2006 | Clarke | H01L 21/76254 |
| | | | 438/455 |
| 2006/0226415 A1 * | 10/2006 | Nishijima | H01L 29/7787 |
| | | | 257/11 |
| 2014/0362536 A1 * | 12/2014 | Mishra | H05K 1/181 |
| | | | 361/710 |
| 2017/0077275 A1 * | 3/2017 | Okazaki | H01L 29/66462 |
| 2017/0077284 A1 * | 3/2017 | Ono | H01L 29/2003 |
| 2019/0123150 A1 * | 4/2019 | MacDonald | H01L 29/66462 |
| 2020/0235028 A1 | 7/2020 | Lee et al. | |
| 2020/0294938 A1 | 9/2020 | Jain et al. | |
| 2021/0125893 A1 * | 4/2021 | Tyhach | H01L 29/66462 |
| 2021/0288170 A1 * | 9/2021 | Appleton, Jr. | H01L 29/205 |

FOREIGN PATENT DOCUMENTS

| | | | | |
|---|---|---|---|---|
| CN | 111048581 A | * | 4/2020 | H01L 29/0649 |
| CN | 111682064 A | * | 9/2020 | H01L 29/0607 |
| CN | 211858658 U | * | 11/2020 | H01L 29/404 |
| CN | 211858659 U | * | 11/2020 | H01L 29/0607 |
| CN | 212848377 U | | 3/2021 | |
| CN | 113314597 A | | 8/2021 | |
| CN | 113314598 A | | 8/2021 | |
| JP | 2010182829 A | * | 8/2010 | |
| JP | 2021-013007 A | | 2/2021 | |
| KR | 20090020739 A | | 2/2009 | |
| KR | 10-2021-0082826 A | | 7/2021 | |
| KR | 2021-0082826 A | | 7/2021 | |
| KR | 102304613 B1 | | 9/2021 | |
| WO | WO-2021080692 A1 | * | 4/2021 | H01L 23/3732 |
| WO | WO-2021230283 A1 | * | 11/2021 | H01L 21/28587 |

OTHER PUBLICATIONS

Liu et al. "Effect of source field plate on the characteristics of off-state, step-stressed AlGaN/GaN high electron mobility transistors", J. Vac. Sci. Technol. B29, Apr. 18, 2011 (Year: 2011).*

Lu et al. "Effect of Source-Connected Field Plate on Electric Field Distribution and Breakdown Voltage in AlGaN/GaN HEMTs", IEEE, 2006 (Year: 2006).*

PCT International Search Report and Written Opinion dated May 19, 2023 for International Application No. PCT/US2023/060452; 11 Pages.

Taiwan Office Action (with English Translation) dated Nov. 21, 2023 for Taiwan Application No. 112102323; 13 Pages.

Office Action issued May 13, 2025, in connection with Korean Patent Application No. 10-2024-7025180, 16 pages.

* cited by examiner

INTEGRATED DIAMOND SUBSTRATE FOR THERMAL MANAGEMENT

BACKGROUND

A conventional device and method provide for diamond to be grown on a backside of a semiconductor wafer after a host substrate has been removed in order to remove heat through epitaxial (epi) layers. Such devices and methods expose semiconductor layers to high temperatures during the growth of the diamond. In addition, removal of the semiconductor wafer from a handle wafer is difficult and may damage an epi layer. The high coefficient of thermal expansion (CTE) between diamond and a semiconductor wafer may cause extreme wafer bow.

Another conventional device and method provide for a semiconductor wafer level bonding of epi material to a diamond substrate after an original host substrate is removed. The semiconductor wafer level transfer of epi requires ultra smooth surfaces and a high degree of flatness in order to transfer the epi.

SUMMARY

In accordance with the concepts described herein, example thermal management devices and methods are provided.

In accordance with the concepts described herein, the present disclosure provides exemplary devices and methods that integrate a diamond substrate with a mature high yielding semiconductor epitaxial and fabrication technology with proven reliability to enable lower channel temperatures at higher power dissipation levels.

In accordance with the concepts described herein, example thermal management devices and methods are provided for cooling monolithic microwave integrated circuits (MMICs).

In accordance with the concepts described herein, example thermal management devices and methods are provided that utilize inventive methods of integrating diamond into an active region to efficiently remove heat generated during operation of an MMIC.

In accordance with the concepts described herein, example thermal management devices and methods are provided that address the problem of thermal limitations for high power amplifiers.

In accordance with the concepts described herein, example thermal management devices and methods are provided that address the integration and performance challenges of combining high power semiconductors with diamond substrates for efficient cooling of transistor channels under long pulse high duty cycle operation.

In accordance with the concepts described herein, an example thermal management devices and methods are provided that utilize a diamond substrate to fabricate passive components that make up an MMIC using standard cleanroom fabrication processes.

In accordance with the concepts described herein, an example thermal management devices and methods are provided that utilize a separate semiconductor wafer (e.g., Gallium Nitride (GaN) on Silicon Carbide (SiC)) to fabricate transistors.

In accordance with the concepts described herein, an example thermal management devices and methods are provided that integrate functionally good transistors to a diamond MMIC circuit using a thermocompression bond (e.g., gold (Au) to gold).

In accordance with the concepts described herein, an example a device for thermal management, includes an integrated circuit (IC) comprising at least one field effect transistor, wherein each at least one FET comprises a gate, a drain, and a source; and a diamond substrate bonded to the gate, the drain, and the source of each of the at least one FETs, wherein the diamond substrate includes at least one tuning element.

The IC may include a semiconductor substrate comprising one of Gallium Nitride (GaN), Silicon Carbide (SiC), and Gallium Arsenide (GaAs).

The integrated circuit includes a monolithic microwave integrated circuit (MMIC).

The IC further includes at least one tuning element.

The at least one tuning element on the IC includes at least one of at least one capacitor, at least one resistor, and at least one inductor.

The diamond substrate includes a single crystal diamond substrate and/or a polycrystalline diamond substrate.

The diamond substrate further includes a metallic contacts configured to bond the diamond substrate to the gate, the drain, and the source of each of the at least one FET.

The metallic contacts include gold (AU) contacts.

The semiconductor substrate and the diamond substrate may each be 100 µm thick.

The AU contacts may be approximately 6 um thick (e.g., 6 um thick in a three layer interconnect architecture). However, the AU contacts may be thinner than 6 um.

A method of thermal management includes forming at least one field effect transistor (FET) on an integrated circuit (IC), wherein each at least one FET comprises a gate, a drain, and a source; and bonding a diamond substrate to the gate, the drain, and the source of each of the at least one FETs, wherein the diamond substrate includes at least one tuning element.

DESCRIPTION OF THE SEVERAL VIEWS OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Like reference numerals designate corresponding parts throughout the different views. Furthermore, embodiments are illustrated by way of example and not limitation in the figures, in which.

DETAILED DESCRIPTION

The present disclosure provides exemplary devices and methods that allow for more efficient cooling of high power MMICs as compared to conventional diamond heat spreader backside methods since, a diamond substrate in exemplary embodiments of the present disclosure is within a few microns of a heat source in a channel such that heat travels through high thermal conductivity Au to reach the diamond substrate.

The present disclosure provides exemplary device and methods that are better suited to a high-volume low-cost manufacturing environment since proven thermocompression bonding technology may be utilized.

The present disclosure provides exemplary devices and methods that avoid integration challenges encountered by conventional devices and methods of fabricating GaN on diamond wafers/MMICs.

The present disclosure provides exemplary devices and methods that provide approximately 1.44 times higher power dissipation than a conventional GaN on SiC field effect transistor (FET) at the same channel temperature.

The present disclosure provides exemplary devices and methods that enable a process flow of a semiconductor wafer to be drastically reduced, which reduces the overall risk to a semiconductor wafer in process (WIP). Layers fabricated on a semiconductor wafer are significant layers and may have the largest impact on radio frequency (RF) performance of an MMIC. A reduced process flow enables quick electrical feedback of process health, reduces risk exposure of inline WIP, and reduces process yield risk.

The present disclosure provides exemplary devices and methods that apply to microwave GaN processes, high-voltage GaN (HV GaN) processes, and Scandium Aluminum Nitride (ScAlN) processes. All HV GaN and ScAlN processes are in need of advanced thermal management devices and methods of the present disclosure.

The present disclosure provides exemplary devices and methods that are applicable to GaN/Diamond related technologies and 5G related technologies.

The present disclosure provides exemplary devices and methods that integrate semiconductor structures onto diamond wafers in order to efficiently remove heat from an active region of a transistor to enable lower operating temperatures which lead to longer device lifetimes and/or higher dissipation powers.

Figure 1:
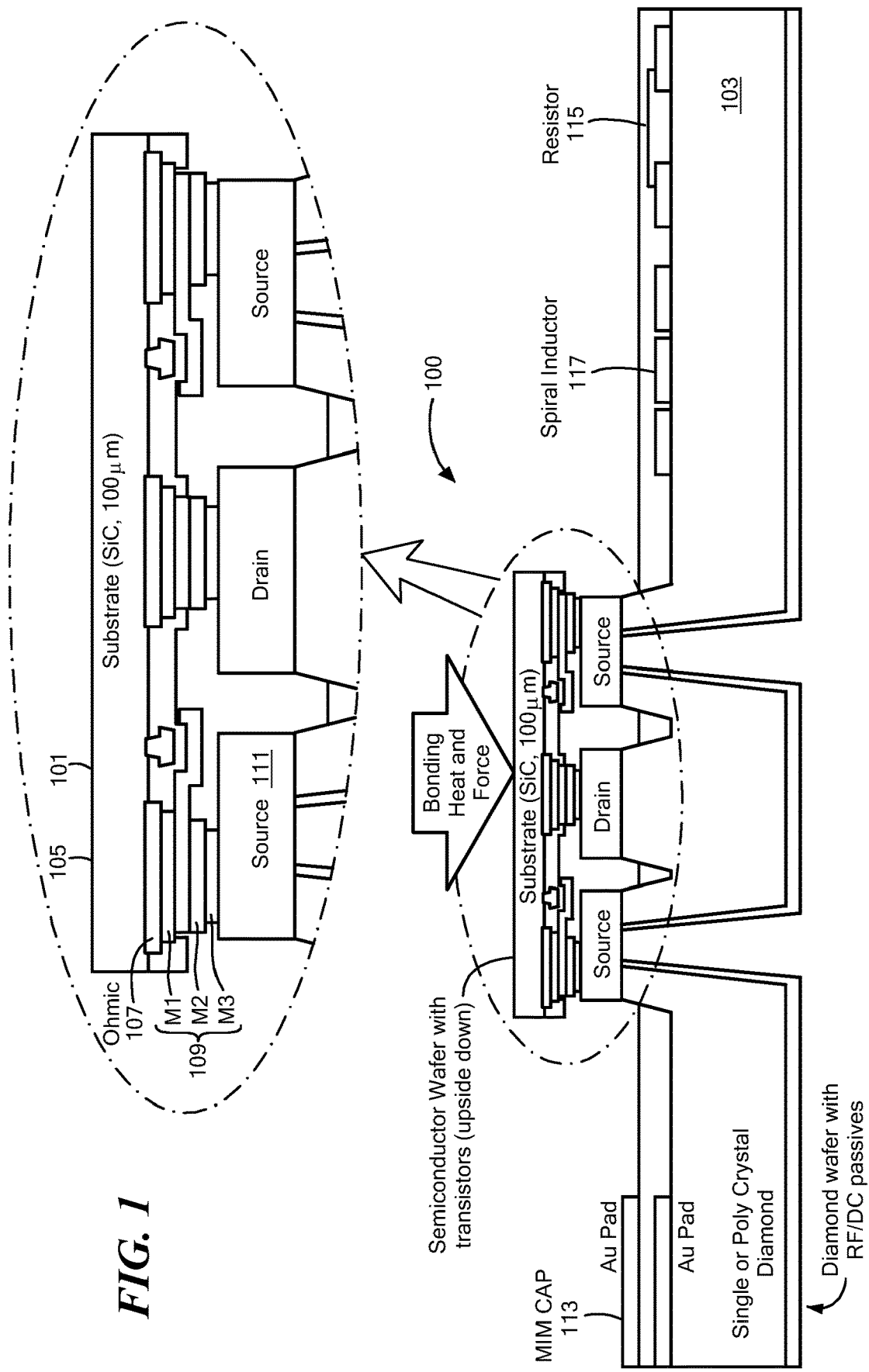
FIG. 1 is an illustration of an example embodiment of the concepts described herein.

FIG. 1 is an illustration of an example embodiment of the concepts described herein. In an example embodiment, a semiconductor device 100 includes an integrated circuit 101 attached to a diamond substrate 103. In an example embodiment, the integrated circuit 101 may include a MMIC that includes a semiconductor substrate 105 and at least one FET 107 formed on the semiconductor substrate 105. In an alternate example embodiment, the semiconductor substrate 105 may include at least one tuning element. The semiconductor substrate 105 may comprise SiC, GaN, GaAs, or any other suitable semiconductor material. The semiconductor substrate 105 and the diamond substrate 103 may each be about 100 um thick, where the diamond substrate 103 may be single crystalline diamond or polycrystalline diamond. However, the present disclosure is not limited thereto.

Each FET 107 includes a drain terminal, a gate terminal, and a source terminal, with an ohmic contact on each of the drain terminal, the gate terminal, and the source terminal. The tuning element may comprise a capacitor, a resistor, an inductor, and/or any other suitable electronic component. At least one metal layer 109 is formed on the ohmic contacts of the drain terminal, the gate terminal, and the source terminal of each FET 107 to enable connection of the drain terminal, the gate terminal, and the source terminal of each FET 107 to the diamond substrate 103.

The diamond substrate 103 includes a metallic contact 111 for each drain terminal, gate terminal, and source terminal of each FET 107 on the integrated circuit 101. In an embodiment, the metallic contact 111 may be gold (Au), where each Au contact is 6 um thick. However, the present disclosure is not limited thereto. In an alternate embodiment, the diamond substrate 103 may include at least one tuning element 113, 115, and 117. The tuning element may comprise a capacitor, a resistor, an inductor, and/or any other suitable electronic component. The Au contacts of the diamond substrate 103 are bonded to each drain terminal, gate terminal, and source terminal of each FET 107 on the integrated circuit 101.

Figure 2:
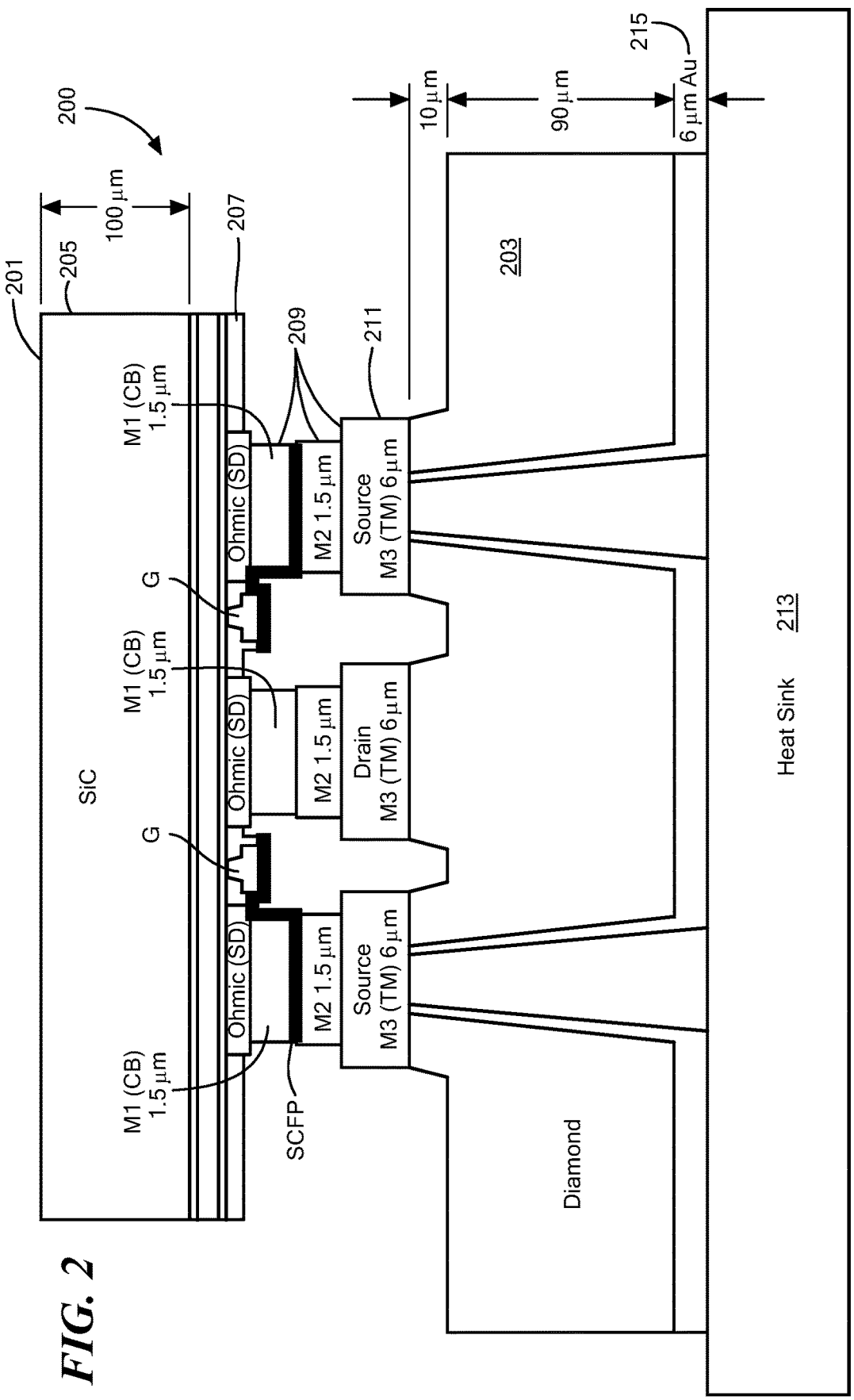
FIG. 2 is an illustration of an alternative example embodiment of the concepts described herein.

FIG. 2 is an illustration of an alternative embodiment of the concepts described herein. In an example embodiment, a semiconductor device 200 includes an integrated circuit 201 attached to a first side of a diamond substrate 203, where a second side of the diamond substrate is attached to a heat sink 213.

The integrated circuit 201 may include a MMIC that includes a semiconductor substrate 205 and at least one FET 207 formed on the semiconductor substrate 205. In an alternate embodiment, the semiconductor substrate 205 may include at least one tuning element. The semiconductor substrate 205 may comprise SiC, GaN, GaAs, or any other suitable semiconductor material. The semiconductor substrate 205 and the diamond substrate 203 may each be about 100 um thick, where the diamond substrate 203 may be single crystalline diamond or polycrystalline diamond. However, the present disclosure is not limited thereto.

Each FET 207 includes a drain terminal, a gate terminal, and a source terminal, with an ohmic contact on each of the drain terminal, the gate terminal, and the source terminal. The tuning element may be a capacitor, a resistor, an inductor, or any other suitable electronic component. At least one metal layer 209 is formed on the ohmic contacts of the drain terminal, the gate terminal, and the source terminal of each FET 207 to enable connection of the drain terminal, the gate terminal, and the source terminal of each FET 207 to the first side of the diamond substrate 203. Each metal layer 209 may be 1.5 um thick. However, the present disclosure is not limited thereto.

The first side of the diamond substrate 203 includes a metallic contact 211 for each drain terminal, gate terminal, and source terminal of each FET 207 on the integrated circuit 201. In an embodiment, the metallic contact 211 may be Au, where each Au contact is 6 um thick. However, the present disclosure is not limited thereto. In an alternate embodiment, the first side of the diamond substrate 203 may include at least one tuning element. The tuning element may be a capacitor, a resistor, an inductor, or any other suitable electronic component. The Au contacts of the first side of the diamond substrate 203 are bonded to each drain terminal, gate terminal, and source terminal of each FET 207 on the integrated circuit 201.

The heat sink 213 is connected to the second side of the diamond substrate 203 via at least one metallic contact 215. The metallic contact 215 may be Au that is 6 um thick. However, the present disclosure is not limited thereto.

Figure 3:
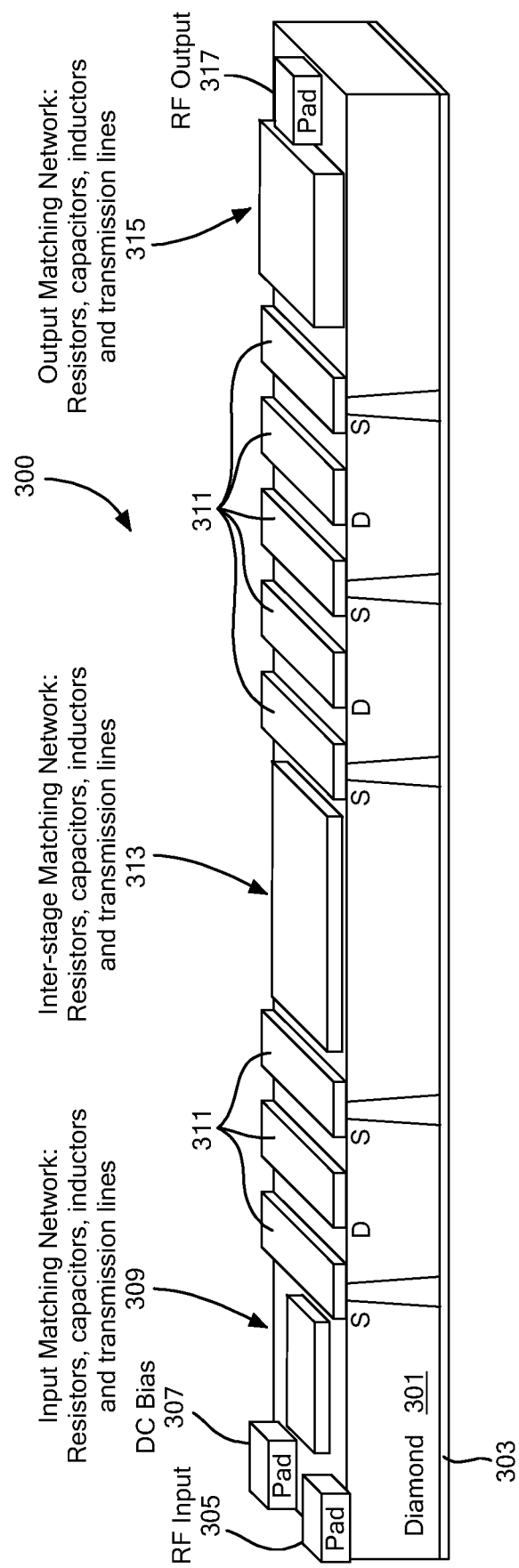
FIG. 3 is an illustration of an example embodiment of a diamond substrate in accordance with the concepts described herein.

FIG. 3 is an illustration of an example embodiment of a diamond substrate 300 in accordance with the concepts described herein. In an example embodiment, the diamond substrate 300 comprises a diamond semiconductor wafer 301, a backside metallization 303, an RF input pad 305, a direct current (DC) bias pad 307, an input matching network 309 (e.g., resistors, capacitors, inductors, and transmission lines), pads 311 to connect to transistor terminals from ICs, an inter-stage matching network 313 (e.g., resistors, capacitors, inductors, and transmission lines), an output matching network 315 (e.g., resistors, capacitors, inductors, and transmission lines), and an RF output pad 317.

The diamond substrate 300 is well suited for lower frequency MMICs with large gate periphery. MMIC passive components (e.g., bond pads, transmission lines, resistors, inductors and individual source vias) are fabricated on the high thermal conductivity diamond substrate 300. Conventional devices only used thin film devices, not MMICs. A MMIC may include multiple transistors. Conventional devices only used singe transistors for a hybrid-style circuit.

Design parameters of the passive components are electrically matched to the diamond substrate 300. The backside of the diamond substrate 300 is metallized since it is the ground plane for the transmission lines and for individual source vias (ISVs) to be connected to ground.

Figure 4:
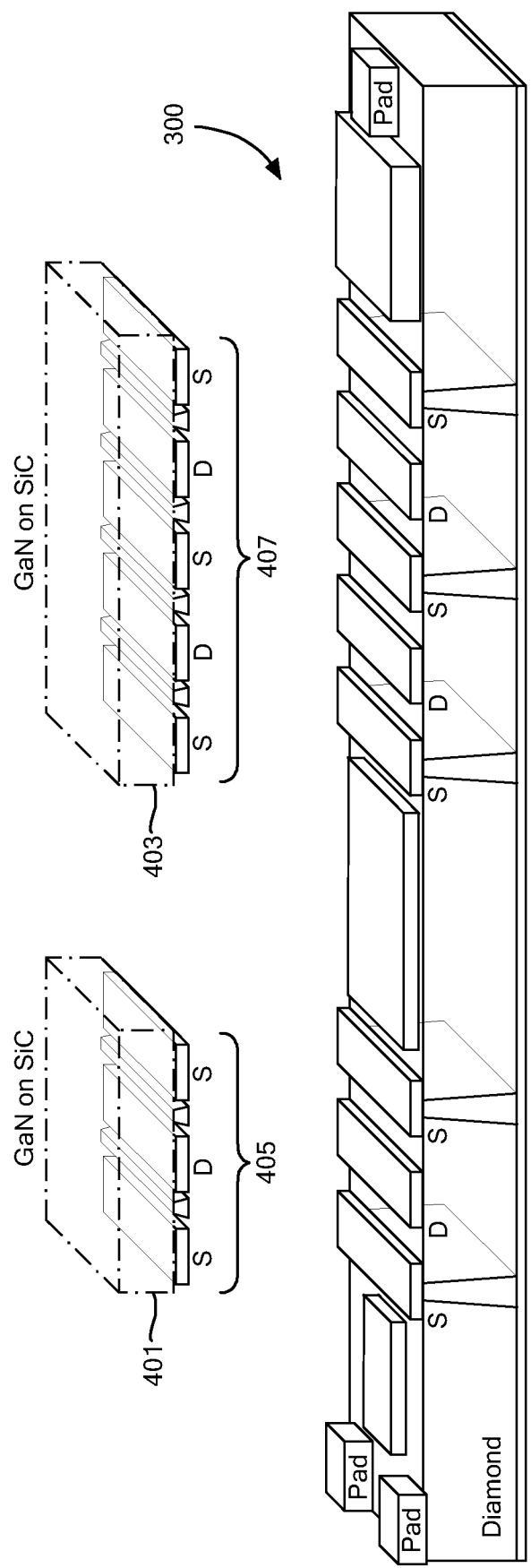
FIG. 4 is an illustration of an example embodiment of the diamond substrate of FIG. 3 and two MMIC ICs in accordance with the concepts described herein.

FIG. 4 is an illustration of an example embodiment of the diamond substrate 300 of FIG. 3 and two MMIC ICs 401 and 403 in accordance with the concepts described herein. In an example embodiment, the diamond substrate 300 is as described above. The first MMIC IC 401 comprises a GaN transistor 405 with multiple transistor terminals (e.g., multiple fingers) on a SiC substrate. The second MMIC 403 comprises a GaN transistor 407 with multiple transistor terminals (e.g., more fingers than an the first MMIC 405) on a SiC substrate.

The GaN on SiC ICs (or chips) contain FETs with multiple fingers for signal amplification and are aligned to the diamond substrate 300.

Figure 5:
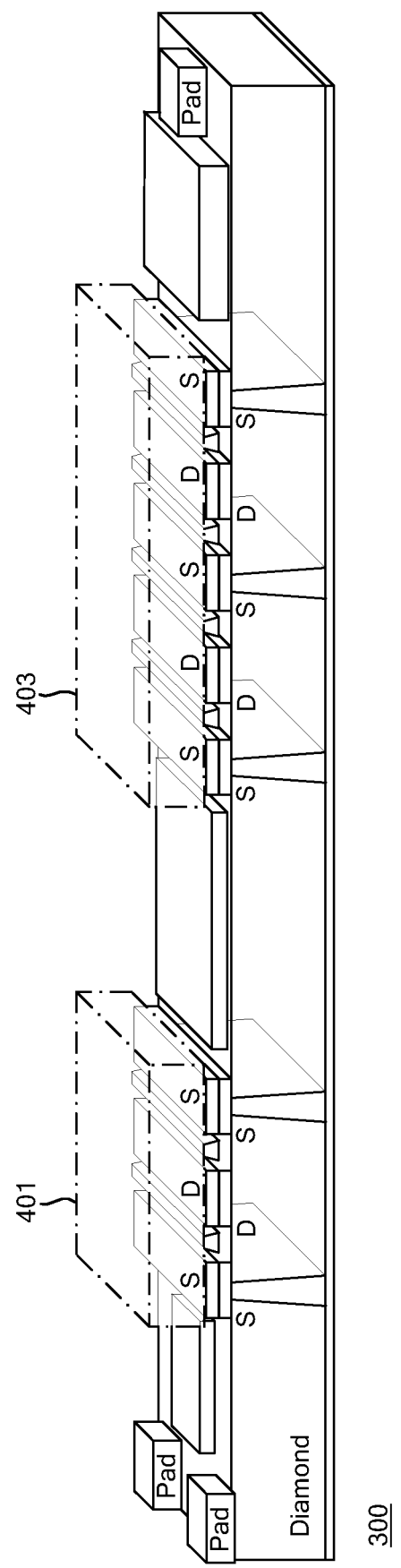
FIG. 5 is an illustration of an example embodiment of the diamond substrate and the MMIC ICs of FIG. 4 with the MMIC ICs attached to the diamond substrate in accordance with the concepts described herein.

FIG. 5 is an illustration of an example embodiment of the diamond substrate 300 and the MMIC ICs 401 and 403 of FIG. 4 with the MMIC ICs 401 and 403 attached to the diamond substrate 300 in accordance with the concepts described herein. The GaN on SiC chips 401 and 403 with FETs are bonded to the diamond substrate 300 to form a high complexity MMIC. This completed circuit provides thermal benefits of diamond along with the mature and reliable GaN on SiC FET process.

Figure 6:
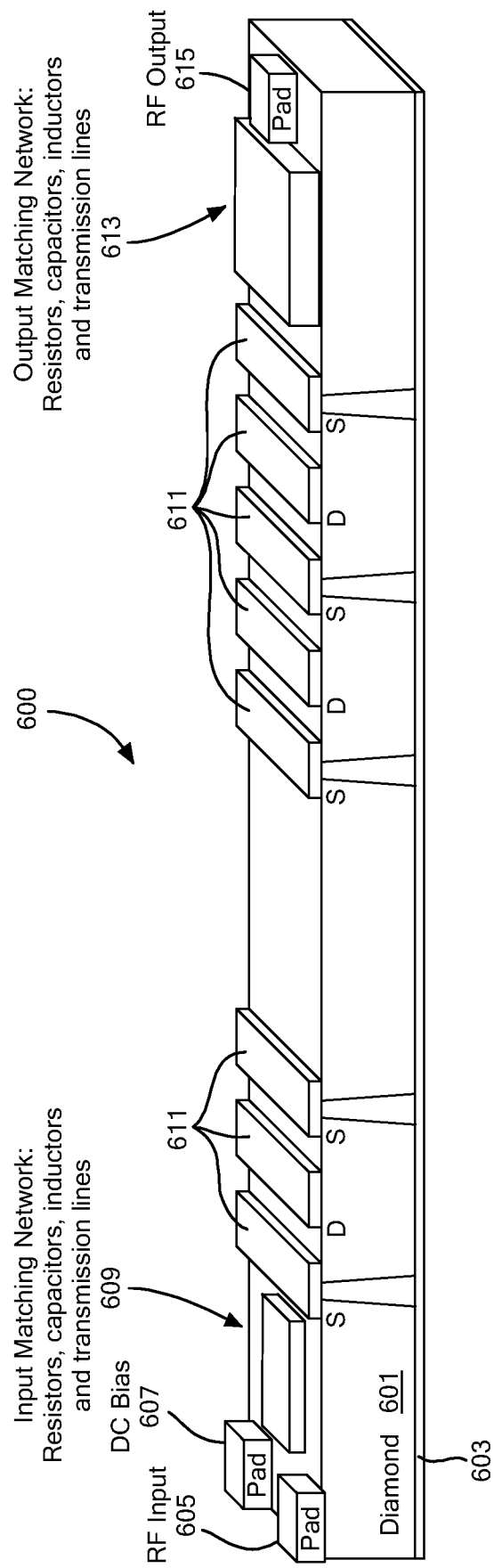
FIG. 6 is an illustration of an example embodiment of a diamond substrate in accordance with the concepts described herein.

FIG. 6 is an illustration of an example embodiment of a diamond substrate 600 in accordance with the concepts described herein. In an example embodiment, the diamond substrate 600 comprises a diamond semiconductor wafer 601, a backside metallization 603, an RF input pad 605, a DC bias pad 607, an input matching network 609 (e.g., resistors, capacitors, inductors, and transmission lines), pads 311 to connect to transistor terminals from an IC, an output matching network 613 (e.g., resistors, capacitors, inductors, and transmission lines), and an RF output pad 615.

The diamond substrate 600 is well suited for higher frequency MMICs with small gate periphery. All MMIC passive components (e.g., bond pads, transmission lines, resistors, inductors, capacitors and individual source vias) are fabricated on the high thermal conductivity diamond substrate 600. Conventional devices only used thin film devices, not MMICs. A MMIC may include multiple transistors. Conventional devices only used singe transistors for a hybrid-style circuit.

All design parameters of the passive components are electrically matched to the diamond substrate 600. The backside of the diamond substrate 600 is metallized since it is the ground plane for the transmission lines and for internal backside vias (ISVs) to be connected to ground.

Figure 7:
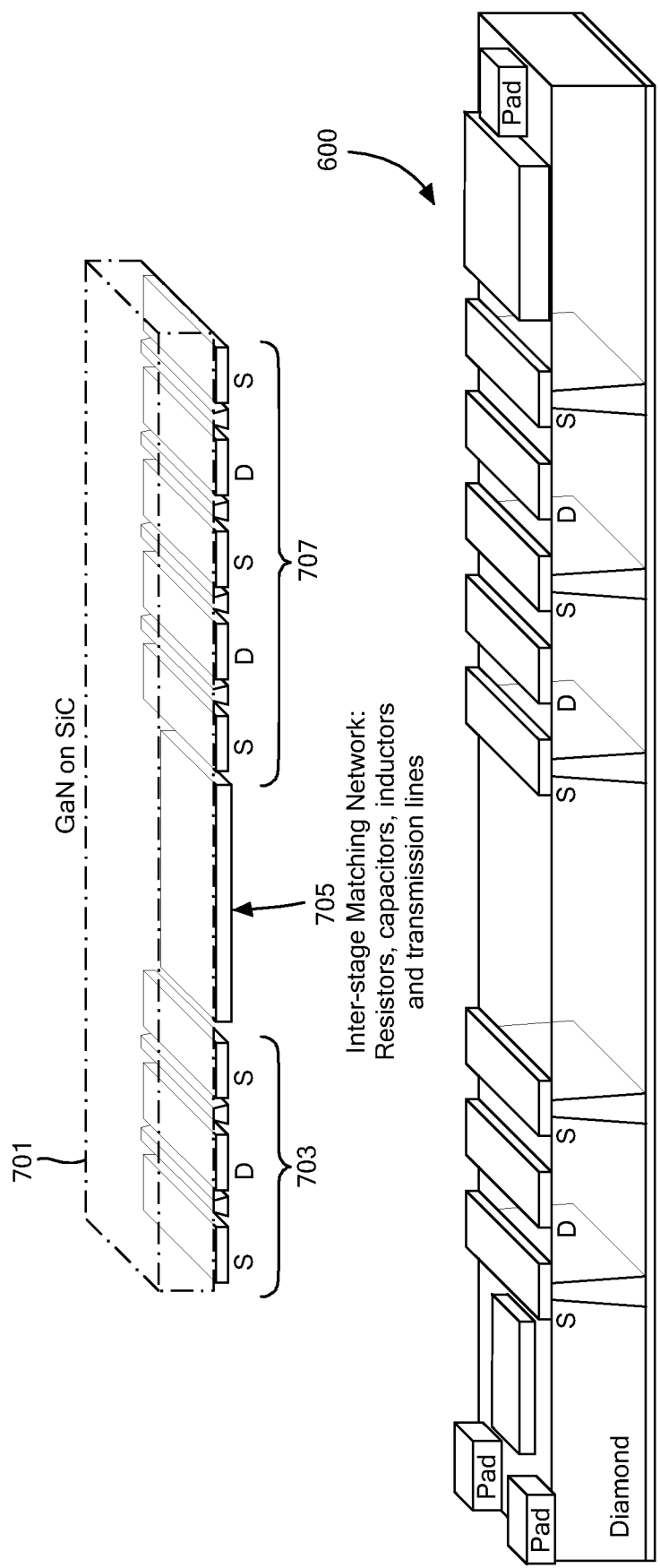
FIG. 7 is an illustration of an example embodiment of the diamond substrate of FIG. 6 and a MMIC IC in accordance with the concepts described herein.

FIG. 7 is an illustration of an example embodiment of the diamond substrate 600 of FIG. 6 and a MMIC IC 701 in accordance with the concepts described herein. In an example embodiment, the diamond substrate 600 is as described above. The MMIC IC 701 comprises a first GaN transistor 703 with multiple transistor terminals (e.g., multiple fingers) on an SiC substrate, an inter-stage matching network 705 (e.g., resistors, capacitors, inductors, and transmission lines), and a second GaN transistor 707 with multiple transistor terminals (e.g., more fingers than on the first GaN transistor 703) on an SiC substrate.

The GaN transistors 703 and 707 and the interstage matching network (designed for GaN on SiC) are fabricated on a single GaN on SiC chip 701. Doing this for higher frequency MMICs results in larger chips that are simpler to bond to the diamond substrate 600.

Figure 8:
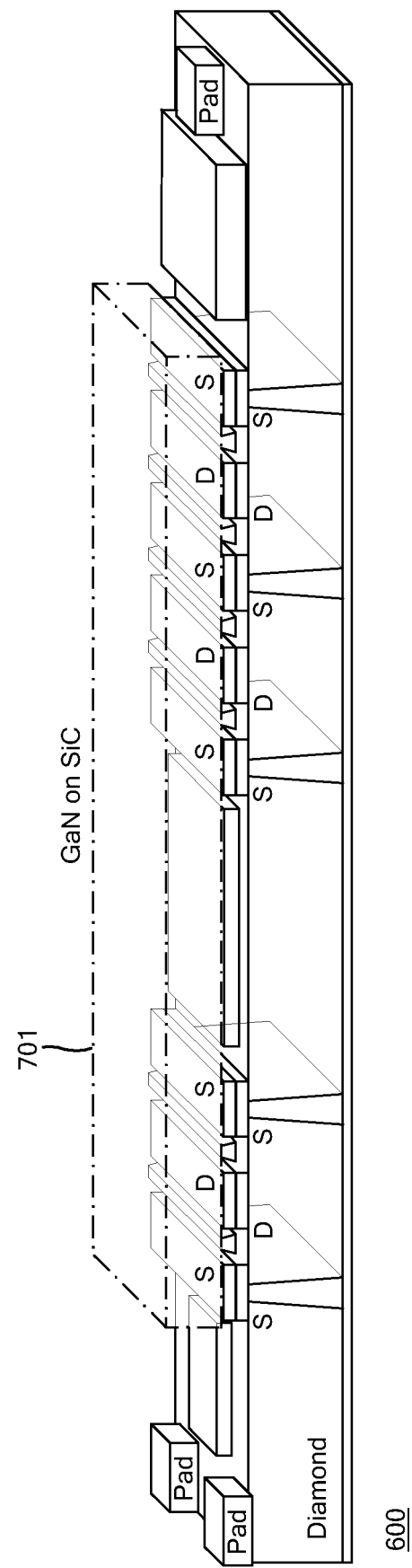
FIG. 8 is an illustration of an example embodiment of the diamond substrate and the MMIC IC of FIG. 7 with the MMIC IC attached to the diamond substrate in accordance with the concepts described herein.

FIG. 8 is an illustration of an example embodiment of the diamond substrate 600 and the MMIC IC 701 of FIG. 7 with the MMIC IC 701 attached to the diamond substrate 600 in accordance with the concepts described herein. The GaN on SiC chip 701 with FETs and interstage matching network is bonded to the diamond substrate 600 to form a high complexity MMIC. This completed circuit provides thermal benefits of diamond along with the mature and reliable GaN on SiC FET process.

Figure 9:
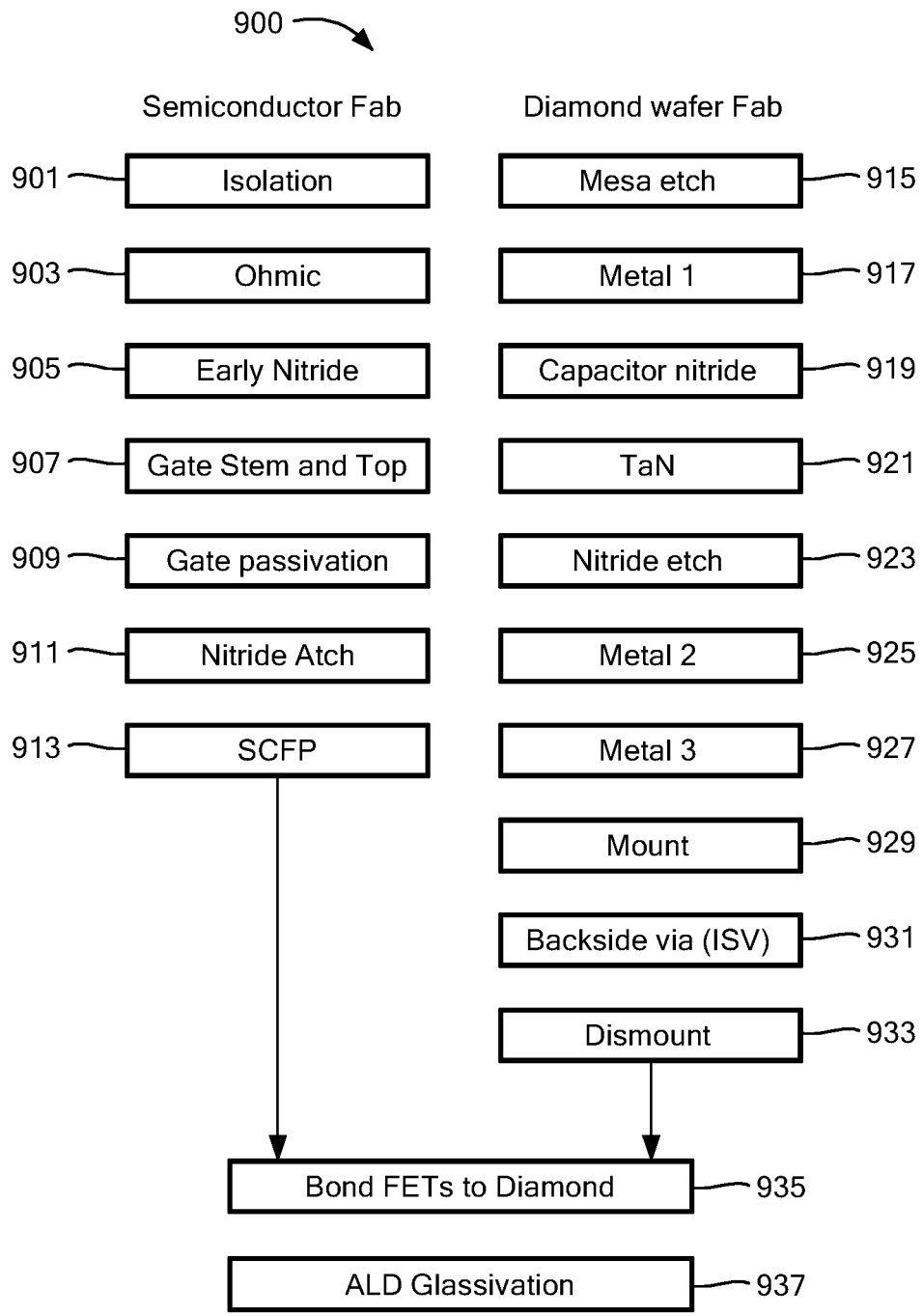
FIG. 9 is a flowchart of an example method of fabricating a semiconductor device in accordance with the concepts described herein.

FIG. 9 is a flowchart of a method 900 of fabricating a semiconductor device in accordance with the concepts described herein. In an example embodiment, the method 900 of fabricating a semiconductor device includes forming isolation areas on a semiconductor substrate in step 901. Step 903 of the method 900 includes forming ohmic contacts on the semiconductor substrate.

Step 905 of the method 900 includes forming a nitride layer on the semiconductor substrate. Step 907 of the method 900 includes forming gate stems and tops on the semiconductor substrate. Step 909 of the method 900 includes passivating the gates. Step 911 of the method 900 includes a nitride etch. Step 913 of the method 900 includes forming a source connected field plate (SCFP). Step 915 of the method 900 includes performing a mesa etch on a first side of a diamond substrate.

Step 917 of the method 900 includes forming a first layer of metal on the first side of the diamond substrate. Step 919 of the method 900 includes forming a capacitator nitride layer on the first side of the diamond substrate. Step 921 of the method 900 includes forming a tantalum nitride (TaN) layer on the first side of the diamond substrate. Step 923 of the method 900 includes performing a nitride etch on the first side of the diamond substrate.

Step 925 of the method 900 includes forming a second layer of metal on the first side of the diamond substrate. Step 927 of the method 900 includes forming a third layer of metal on the first side of the diamond substrate. Step 929 of the method 900 includes mounting the first side of the diamond substrate onto a handle wafer. Step 931 of the method 900 includes forming an ISV on a second side of the diamond substrate.

Step 933 of the method 900 includes dismounting the diamond substrate from the handle wafer. Step 935 of the method 900 includes bonding the diamond substrate to FETs formed on the semiconductor substrate. Step 937 of the method 900 includes forming a passivation layer on the result of step 935 by atomic layer deposition (ALD) glassivation.

Figure 10:
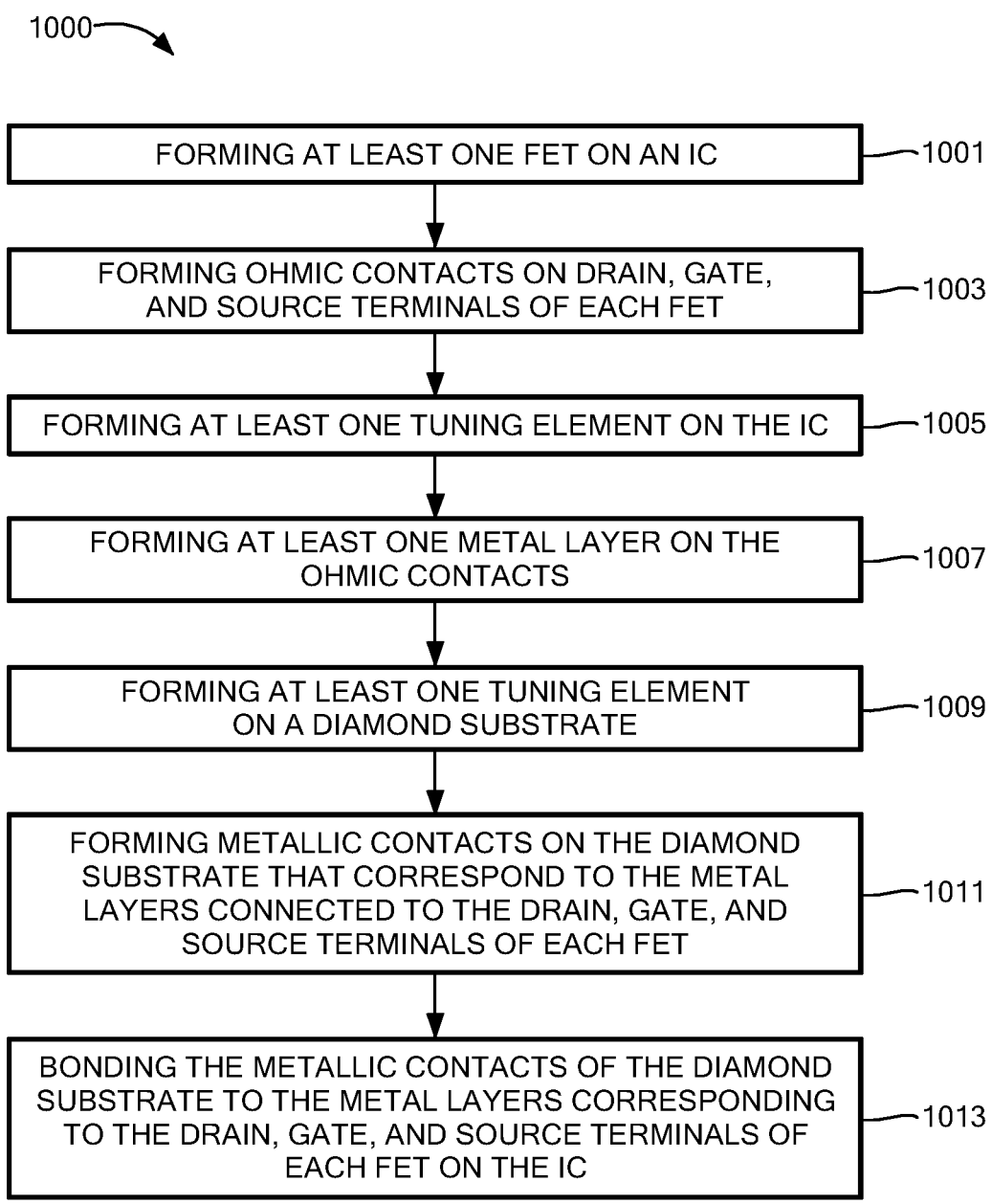
FIG. 10 is a flowchart of an alternative example method of fabricating a semiconductor device in accordance with the concepts described herein.

FIG. 10 is a flowchart of an alternative method 1000 of fabricating a semiconductor device in accordance with the concepts described herein. In an example embodiment, the method 1000 of fabricating a semiconductor device includes forming at least one FET on an integrated circuit (IC) in step 1001, where each FET includes a drain terminal, a gate terminal, and a source terminal. In an example embodiment, the integrated circuit may include a MMIC that includes a semiconductor substrate and the at least one FET formed on the semiconductor substrate. In an example embodiment, the semiconductor substrate may be SiC, GaN, GaAs, or any other suitable semiconductor material. In an example embodiment, the semiconductor substrate may be 100 um thick. However, the present disclosure is not limited thereto.

Step 1003 of the method 1000 includes forming ohmic contacts on the drain terminal, the gate terminal, and the source terminal of each FET on the integrated circuit. Step 1005 of the method 1000 includes forming at least one tuning element on the integrated circuit. In an example embodiment, the at least one tuning element may be a capacitor, a resistor, an inductor, or any other suitable electronic component. Step 1007 of the method 1000 includes forming at least one metal layer on the ohmic contacts of the drain terminal, the gate terminal, and the source terminal of each FET.

Step 1009 of the method 1000 includes forming at least one tuning element on a diamond substrate. In an example embodiment, the tuning element may be a capacitor, a resistor, an inductor, or any other suitable electronic component. In an example embodiment, the diamond substrate may be 100 um thick, where the diamond substrate may be single crystalline diamond or polycrystalline diamond. However, the present disclosure is not limited thereto.

Step 1011 of the method 1000 includes forming metallic contacts on the diamond substrate that correspond to the metal layers connected to the drain terminal, the gate terminal, and the source terminal of each FET on the integrated circuit. In an example embodiment, the metallic contact may be Au, where each Au contact is 6 um thick. However, the present disclosure is not limited thereto. Step 1013 of the method 1000 includes bonding the metallic contacts of the diamond substrate to the metal layers corresponding to the drain terminal, the gate terminal, and the source terminal of each FET on the integrated circuit.

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable sub combination. Other embodiments not specifically described herein are also within the scope of the following claims.

Various embodiments of the concepts, systems, devices, structures and techniques sought to be protected are described herein with reference to the related drawings. As noted above, in embodiments, the concepts and features described herein may be embodied in a digital multi-beam beamforming system. Alternative embodiments can be devised without departing from the scope of the concepts, systems, devices, structures and techniques described herein.

It is noted that various connections and positional relationships (e.g., over, below, adjacent, etc.) are set forth between elements in the above description and in the drawings. These connections and/or positional relationships, unless specified otherwise, can be direct or indirect, and the described concepts, systems, devices, structures and techniques are not intended to be limiting in this respect. Accordingly, a coupling of entities can refer to either a direct or an indirect coupling, and a positional relationship between entities can be a direct or indirect positional relationship.

As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). The following definitions and abbreviations are to be used for the interpretation of the claims and the specification. As used herein, the terms "comprises," "comprising, "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration. Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection".

References in the specification to "one embodiment, "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description herein, terms such as "upper," "lower," "right," "left," "vertical," "horizontal, "top," "bottom," (to name but a few examples) and derivatives thereof shall relate to the described structures and methods, as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements. Such terms are sometimes referred to as directional or positional terms.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways.

Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

What is claimed is:

1. A device for thermal management, comprising:
    an integrated circuit (IC) comprising at least one field effect transistor (FET), wherein each of the at least one FET comprises a gate, a drain, and a source, and wherein the gate and the source are interconnected by a source connected field plate (SCFP), wherein the SCFP is directly connected to the gate and to at least one metal layer on the source;
    a diamond substrate having a first side bonded to the drain and the source of each of the at least one FET and connected to the gate of each of the at least one FET through the source and the SCFP, the diamond substrate configured to receive heat transferred from the at least one FET, wherein the diamond substrate includes at least one tuning element;
    a heat sink on a second side of the diamond substrate opposite the first side of the diamond substrate; and
    at least one metal contact configured to connect the heat sink to the second side of the diamond substrate and transfer the heat from the diamond substrate to the heat sink.

2. The device of claim 1, wherein the IC further comprises a semiconductor substrate comprising at least one of: Gallium Nitride (GaN), Silicon Carbide (SiC), or Gallium Arsenide (GaAs).

3. The device of claim 1, wherein the IC comprises a monolithic microwave integrated circuit (MMIC).

4. The device of claim 1, wherein the at least one tuning element of the diamond substrate comprises at least one of: at least one capacitor, at least one resistor, or at least one inductor.

5. The device of claim 1, wherein the diamond substrate comprises at least one of: a single crystal diamond substrate or a polycrystalline diamond substrate.

6. The device of claim 1, wherein the diamond substrate further comprises metallic contacts configured to bond the diamond substrate to the gate, the drain, and the source of each of the at least one FET.

7. The device of claim 6, wherein the metallic contacts comprise gold (AU) contacts.

8. The device of claim 2, wherein the semiconductor substrate and the diamond substrate are each 100 μm thick.

9. The device of claim 7, wherein the AU contacts are at least 6 μm thick.

10. A method of thermal management, comprising:
    forming at least one field effect transistor (FET) in an integrated circuit (IC), wherein each of the at least one FET comprises a gate, a drain, and a source, and wherein the gate and the source are interconnected by a source connected field plate (SCFP), wherein the SCFP is directly connected to the gate and to at least one metal layer on the source;
    bonding a first side of a diamond substrate to the drain and the source of each of the at least one FET, wherein the diamond substrate includes at least one tuning element;
    connecting the gate of each of the at least one FET to the first side of the diamond substrate through the source and the at least one metal layer; and
    connecting a heat sink to a second side of the diamond substrate opposite the first side of the diamond substrate using at least one metal contact, the diamond substrate configured to transfer heat from the at least one FET to the heat sink.

11. The method of claim 10, wherein the IC comprises a semiconductor substrate comprising at least one of: Gallium Nitride (GaN), Silicon Carbide (SiC), or Gallium Arsenide (GaAs).

12. The method of claim 10, wherein the IC comprises a monolithic microwave integrated circuit (MMIC).

13. The method of claim 10, wherein the at least one tuning element of the diamond substrate comprises at least one of: at least one capacitor, at least one resistor, or at least one inductor.

14. The method of claim 10, wherein the diamond substrate comprises at least one of: a single crystal diamond substrate or a polycrystalline diamond substrate.

15. The method of claim 10, wherein the diamond substrate further comprises metallic contacts configured to bond the diamond substrate to the gate, the drain, and the source of each of the at least one FET.

16. The method of claim 15, wherein the metallic contacts comprise gold (AU) contacts.

17. The method of claim 11, wherein the semiconductor substrate and the diamond substrate are each 100 µm thick.

18. The method of claim 16, wherein the AU contacts are at least 6 µm thick.

19. A device for thermal management, comprising:
an integrated circuit (IC) comprising at least one field effect transistor (FET), wherein each of the at least one FET comprises a gate, a drain, and a source, and wherein the gate and the source are interconnected by a source connected field plate (SCFP), wherein the SCFP is directly connected to the gate and to at least one metal layer on the source;
a diamond substrate having a first side bonded to the drain and the source of each of the at least one FET and connected to the gate of each of the at least one FET through the source and the at least one metal layer, the diamond substrate configured to receive heat transferred from the at least one FET, wherein the diamond substrate includes at least one tuning element; and
a metallization layer located on a second side of the diamond substrate opposite the first side of the diamond substrate and configured to receive the heat transferred from the at least one FET through the diamond substrate.

20. The device of claim 3, wherein the integrated circuit (IC) comprises a lower frequency MMIC having a large gate periphery.

* * * * *